United States Patent
Kim et al.

(10) Patent No.: US 12,207,404 B2
(45) Date of Patent: Jan. 21, 2025

(54) CIRCUIT BOARD

(71) Applicant: LG INNOTEK CO., LTD., Seoul (KR)

(72) Inventors: Yong Suk Kim, Seoul (KR); Dong Hwa Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 277 days.

(21) Appl. No.: 17/621,944

(22) PCT Filed: Jun. 19, 2020

(86) PCT No.: PCT/KR2020/007994
§ 371 (c)(1),
(2) Date: Dec. 22, 2021

(87) PCT Pub. No.: WO2020/262891
PCT Pub. Date: Dec. 30, 2020

(65) Prior Publication Data
US 2022/0256699 A1  Aug. 11, 2022

(30) Foreign Application Priority Data
Jun. 25, 2019 (KR) .......................... 10-2019-0075947

(51) Int. Cl.
*H05K 1/11* (2006.01)
*H05K 1/09* (2006.01)
(Continued)

(52) U.S. Cl.
CPC ............... *H05K 1/113* (2013.01); *H05K 1/09* (2013.01); *H05K 1/0242* (2013.01); *H05K 1/11* (2013.01);
(Continued)

(58) Field of Classification Search
CPC .. H05K 1/113; H05K 1/09; H05K 2201/0209; H05K 2201/0212;
(Continued)

(56) References Cited

U.S. PATENT DOCUMENTS 5,250,629 A  10/1993 Tani et al.
5,709,957 A * 1/1998 Chiang .................. H05K 3/389
428/626
(Continued)

FOREIGN PATENT DOCUMENTS

CN  102037157 A  4/2011
CN  107926125 A  4/2018
(Continued)

OTHER PUBLICATIONS

Chinese Office Action dated Jul. 7, 2023 issued in Application 202080046790.0.
(Continued)

*Primary Examiner* — Ishwarbhai B Patel
(74) *Attorney, Agent, or Firm* — KED & ASSOCIATES, LLP

(57) ABSTRACT

A circuit board may include an insulating layer; a circuit pattern disposed above the top surface of or below the bottom surface of the insulating layer; and a buffer layer disposed between the insulating layer and the circuit pattern, the buffer layer comprising carbon atoms, nitrogen atoms, oxygen atoms, silicon atoms, sulfur atoms, and metal atoms. The ratio of the carbon atoms to the metal atoms ((carbon atom/copper atom)*100) is within a range of 5-7; the ratio of the nitrogen atoms to the metal atoms ((nitrogen atom/copper atom)*100) is within a range of 1.5-7; the ratio of the oxygen atoms to the metal atoms ((oxygen atom/copper atom)*100) is within a range of 1.1-1.9; and the ratio of the silicon atoms to the metal atoms ((silicon atom/copper atom)*100) is within a range of 0.5-0.9; and the ratio of the sulfur atoms to the metal atoms ((sulfur atom/copper atom)*100) is within a range of 0.5-1.5.

16 Claims, 3 Drawing Sheets

(51) Int. Cl.
  *H05K 1/18* (2006.01)
  *H05K 1/02* (2006.01)
(52) U.S. Cl.
  CPC ....... *H05K 1/18* (2013.01); *H05K 2201/0209* (2013.01); *H05K 2201/0212* (2013.01)
(58) Field of Classification Search
  CPC ...... H05K 1/0242; H05K 3/389; H05K 3/388; H05K 3/38
  See application file for complete search history.

(56) References Cited

U.S. PATENT DOCUMENTS

| | | | | |
|---|---|---|---|---|
| 6,824,880 | B1* | 11/2004 | Admasu | C23C 26/00 |
| | | | | 428/447 |
| 10,143,083 | B2* | 11/2018 | Sugiura | H05K 3/388 |
| 10,285,268 | B2 | 5/2019 | Park | |
| 10,763,002 | B2 | 9/2020 | Matsuura | |
| 10,941,323 | B2 | 3/2021 | Hirai et al. | |
| 2009/0317617 | A1* | 12/2009 | Sato | B41J 2/1634 |
| | | | | 428/343 |
| 2011/0160412 | A1 | 6/2011 | Thieuleux et al. | |
| 2012/0125514 | A1* | 5/2012 | Wei | H05K 3/389 |
| | | | | 156/60 |
| 2012/0168075 | A1 | 7/2012 | Abys et al. | |
| 2017/0181279 | A1* | 6/2017 | Koike | H05K 1/11 |
| 2018/0151268 | A1* | 5/2018 | Matsuura | B32B 17/061 |

FOREIGN PATENT DOCUMENTS

| | | |
|---|---|---|
| JP | 05-017533 | 1/1993 |
| JP | 2006-253185 A | 9/2006 |
| JP | 2008-198953 | 8/2008 |
| JP | 2018-011033 | 1/2018 |
| JP | 2019-025859 | 2/2019 |
| KR | 10-2017-0116129 A | 10/2017 |
| KR | 10-2017-0133996 A | 12/2017 |

OTHER PUBLICATIONS

International Search Report dated Sep. 25, 2020 issued in Application No. PCT/KR2020/007994.

Korean Office Action dated Aug. 5, 2024 issued in Application 10-2020-0054668.

* cited by examiner

【Fig. 1】
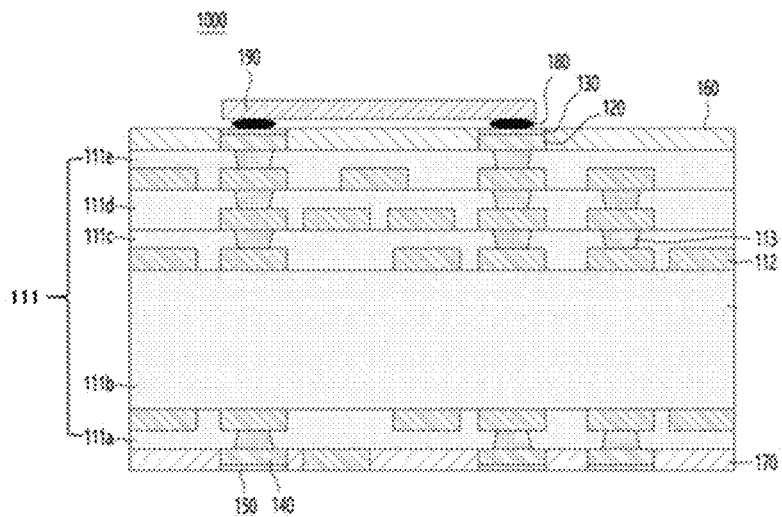
【Fig. 2】
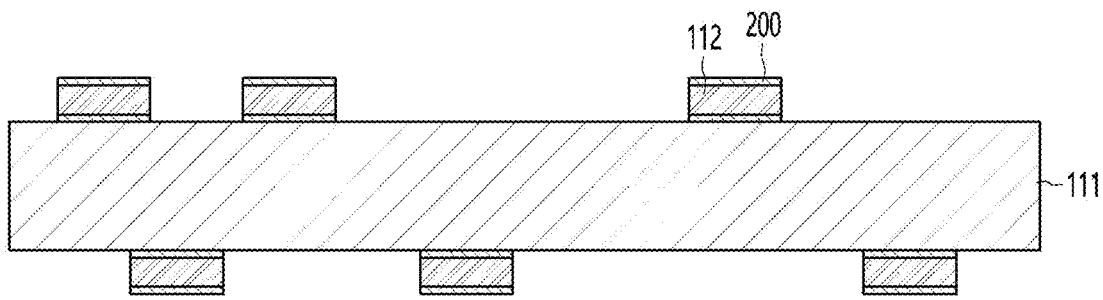

【FIG. 3】
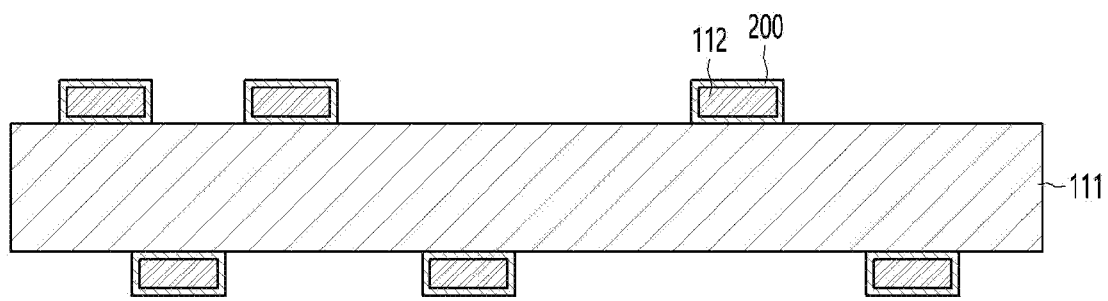
【FIG. 4】
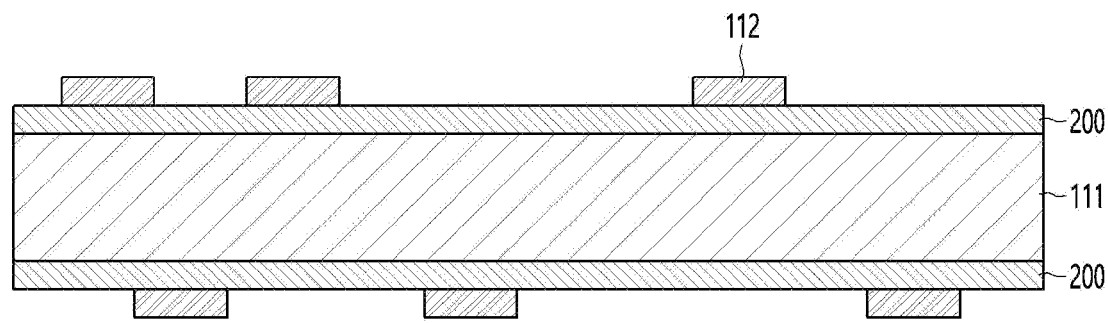
【FIG. 5】
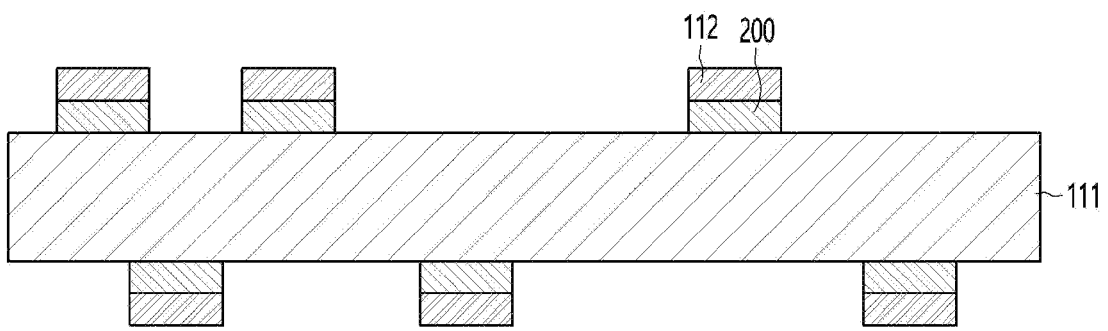

[FIG. 6]
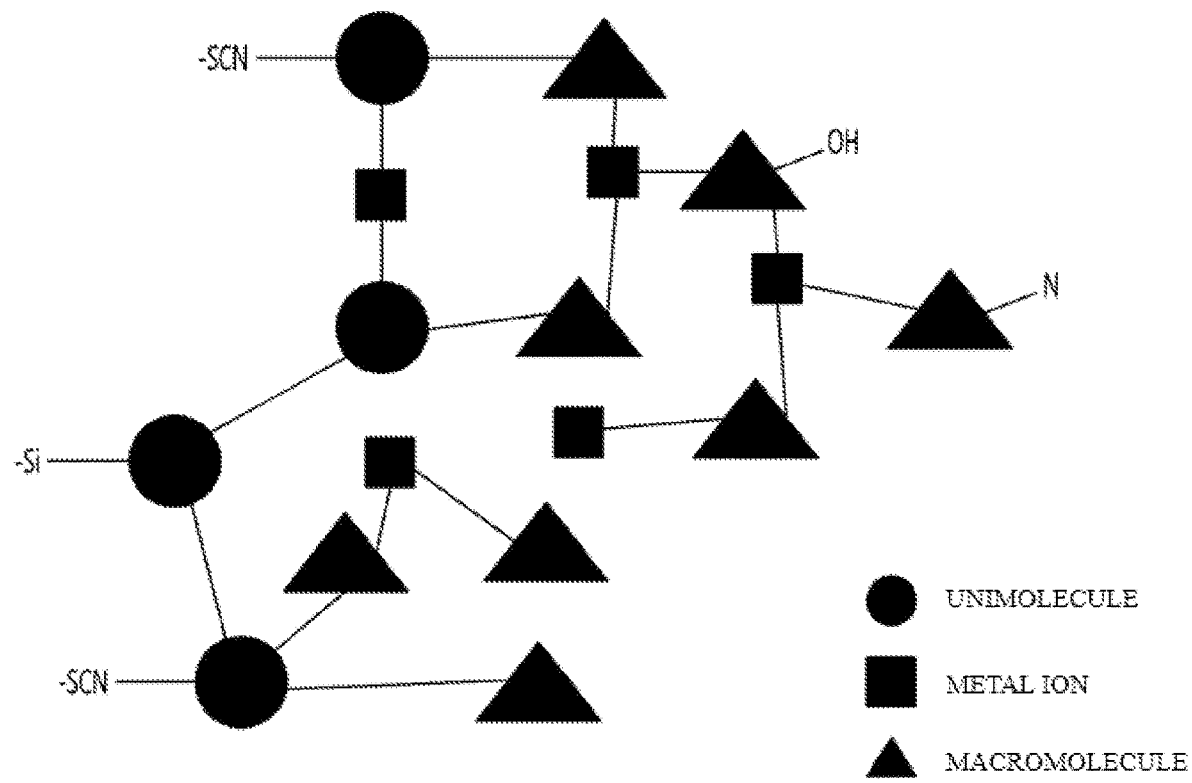

CIRCUIT BOARD

CROSS-REFERENCE TO RELATED PATENT APPLICATIONS

This application is a U.S. National Stage Application under 35 U.S.C. § 371 of PCT Application No. PCT/KR2020/007994, filed Jun. 19, 2020, which claims priority to Korean Patent Application No. 10-2019-0075947, filed Jun. 25, 2019, whose entire disclosures are hereby incorporated by reference.

TECHNICAL FIELD

The present invention relates to a circuit board.

BACKGROUND ART

A printed circuit board (PCB) is formed by printing a circuit line pattern at an electrical insulating substrate with a conductive material such as copper, and thus the PCB refers to a board just before electronic components are mounted thereon. That is, in order to densely mount various types of electronic components on a planar surface, the PCB refers to a circuit board having a planar surface on which a mounting position of each component is fixed and a circuit pattern connecting the components is fixedly printed.

In general, as a surface processing method for a circuit pattern included in the above-described PCB, an organic solderability preservative (OSP) method, an electrolytic nickel/gold method, an electrolytic nickel/gold-cobalt alloy method, an electroless nickel/palladium/gold method, etc. Are used.

In this case, the above-described surface processing methods vary depending on a use thereof, and the use includes, for example, soldering, wire bonding, and a connector.

Components mounted on the printed circuit board may transmit signals generated from the components by circuit patterns connected to the components.

Meanwhile, recently, with advancement of functionality in portable electronic devices and the like, high-frequency of signals are in progress in order to perform high-speed processing of a large amount of information, and a circuit pattern of a printed circuit board suitable for high-frequency applications is required.

Such a circuit pattern of a printed circuit board is required to reduce transmission loss in order to enable transmission without deteriorating the quality of high frequency signals.

The transmission loss of the circuit pattern of the printed circuit board mainly consists of conductor loss due to a copper foil and dielectric loss due to an insulator.

Meanwhile, the conductor loss due to the copper foil is related to a surface roughness of the circuit pattern. That is, as the surface roughness of the circuit pattern increases, the transmission loss may increase due to a skin effect.

Therefore, when the surface roughness of the circuit pattern is reduced, there is an effect of preventing the reduction of the transmission loss, but there is a problem that adhesion between the circuit pattern and an insulating layer is reduced.

Therefore, there is a need for a printed circuit board having a new structure capable of preventing a decrease in the adhesion between the circuit pattern and the insulating layer while reducing the surface roughness of the circuit pattern.

DISCLOSURE

Technical Problem

An embodiment is directed to providing a circuit board having improved reliability by improving adhesion between an insulating layer and a circuit pattern.

Technical Solution

A circuit board according to an embodiment includes: an insulating layer; a circuit pattern disposed on an upper surface or under a lower surface of the insulating layer, and a buffer layer disposed between the insulating layer and the circuit pattern, wherein the buffer layer includes carbon atoms, nitrogen atoms, oxygen atoms, silicon atoms, sulfur atoms, and metal atoms, a ratio of the carbon atoms to the metal atoms ((carbon atom/copper atom)*100) is within a range of 5 to 7, a ratio of the nitrogen atoms to the metal atoms ((nitrogen atom/copper atom)*100) is within a range of 1.5 to 7, a ratio of the oxygen atoms to the metal atoms ((oxygen atom/copper atom)*100) is within a range of 1.1 to 1.9, a ratio of the silicon atoms to the metal atoms ((silicon atom/copper atom)*100) is within a range of 0.5 to 0.9, and a ratio of the sulfur atoms to the metal atoms (sulfur atom/copper atom)*100) is within a range of 0.5 to 1.5.

A circuit board according to an embodiment includes: an insulating layer; a circuit pattern disposed on an upper surface or under a lower surface of the insulating layer, and a buffer layer disposed between the insulating layer and the circuit pattern, wherein the buffer layer includes a first functional group bonded to the insulating layer and a second functional group bonded to the circuit pattern, and the first functional group and the second functional group include at least one of the carbon atoms, the nitrogen atoms, the oxygen atoms, the silicon atoms, and the sulfur atoms.

Advantageous Effects

A circuit board according to an embodiment may include a buffer layer disposed between an insulating layer and a circuit pattern.

That is, in the circuit board according to the embodiment, the buffer layer may be formed on a surface of the circuit pattern or the buffer layer may be formed on the insulating layer.

The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that adhesion is reduced.

Therefore, by disposing a buffer layer chemically bonded to the insulating layer and the circuit pattern respectively between the insulating layer and the circuit pattern, the adhesion between the insulating layer and the circuit pattern may be improved.

That is, the buffer layer includes a plurality of functional groups bonded to the insulating layer and the circuit pattern, and the functional groups are chemically bonded to the insulating layer and the circuit pattern by a covalent bond or a coordination bond, thereby forming improving the adhesion between the insulating layer and the circuit pattern.

Accordingly, even when the surface roughness of the insulating layer is reduced, it is possible to secure adhesion reliability between the insulating layer and the circuit pattern.

Therefore, even when the circuit board according to the embodiment is used for high-frequency applications, it is possible to reduce the transmission loss of high-frequency signals by keeping the surface roughness of the circuit pattern low, and even when the surface roughness of the circuit pattern is kept low, since the adhesion between the insulating layer and the circuit pattern can be ensured by the buffer layer, overall reliability of the circuit pattern can be secured.

DESCRIPTION OF DRAWINGS

FIG. 1 is a view illustrating a cross-sectional view of a circuit board according to an embodiment.

FIGS. 2 through 5 are views for describing arrangement relationship of a buffer layer of the circuit board according to the embodiment.

FIG. 6 is a view illustrating a simple structural formula of an insulating layer of the circuit board according to the embodiment.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively bonded and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be bonded in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "bonded", or "connected" to another element, it may include not only when the element is directly "connected" to, "bonded" to, or "connected" to other elements, but also when the element is "connected", "bonded", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a circuit board according to an embodiment will be described with reference to drawings.

Referring to FIG. 1, a circuit board according to an embodiment may include an insulating substrate 110, a first pad 120, a first upper metal layer 130, a second pad 140, a second upper metal layer 150, a first passivation layer 160, a second passivation layer 170, a solder paste 180, and an electronic component 190.

The insulating substrate 110 may have a flat plate structure. The insulating substrate 110 may be a printed circuit board (PCB). Here, the insulating substrate 110 may be implemented as a single substrate, and alternatively, may be implemented as a multilayer substrate in which a plurality of insulating layers are sequentially stacked.

Accordingly, the insulating substrate 110 includes a plurality of insulating layers 111. As shown in FIG. 2, the plurality of insulating layers 111 may include a first insulating layer 111a, a second insulating layer 111b, a third insulating layer 111c, a fourth insulating layer 111d, and a fifth insulating layer 111e from an uppermost portion. In addition, a circuit pattern 112 may be disposed at each of surfaces of the first to fifth insulating layers. That is, the circuit pattern 112 may be disposed on at least one of both surfaces of the first to fifth insulating layers.

The plurality of insulating layers 111 is a substrate on which an electrical circuit capable of changing wirings is disposed and may include all of printing, a wiring plate, and an insulating substrate which are formed of an insulation material which is able to form the circuit pattern 112 at a surface of the insulating layer.

The plurality of insulating layers 111 may include prepreg including glass fiber. In detail, the plurality of insulating layers 111 may include an epoxy resin and a material in which glass fiber and silicon-based filler are dispersed in the epoxy resin.

In addition, the plurality of insulating layers 111 may be rigid or flexible. For example, the insulating layer 111 may include glass or plastic. Specifically, the insulating layer 111 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the insulating layer 111 may include an optically isotropic film. As an example, the insulating layer 111 may include cyclic olefin copolymer (COC), cyclic olefin polymer (COP), optically isotropic PC, optically isotropic polymethylmethacrylate (PMMA), etc.

Further, the insulating layer 111 may be partially bent while having a curved surface. That is, the insulating layer 111 may partially have a plane and may partially be bent while having a curved surface. Specifically, an end portion of the insulating layer 111 may be bent while having a curved surface, or bent or crooked while having a surface with a random curvature.

Furthermore, the insulating layer 111 may be a flexible substrate having flexibility. Further, the insulating layer 111 may be a curved or bent substrate. In this case, the insulating layer 111 may represent a wiring layout for electrical wirings which connect circuit components based on a circuit design, and electrical conductors may be disposed on an insulation material. Furthermore, electrical components may be mounted on the insulating layer 111, and the insulating layer 111 may form wirings configured to connect the electrical components to make a circuit, and may mechanically fix the components besides functioning to electrically connect the components.

Each of the circuit patterns 112 is disposed at the surface of the insulating layer 111. The circuit pattern 112 may be a wiring for transmitting an electrical signal, and may be formed of a metal material having high electrical conductivity. To this end, the circuit pattern 112 may be formed of at least one metal material selected from among gold (Au), silver (Ag), platinum (Pt), titanium (Ti), tin (Sn), copper (Cu), and zinc (Zn).

In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 112 may be formed of copper (Cu) having high electrical conductivity and a relatively low cost.

The circuit pattern 112 may be formed by a general process of manufacturing a PCB, such as an additive process, a subtractive process, a modified semi additive process (MSAP), a semi additive process (SAP), etc., and detailed descriptions thereof will be omitted herein.

Meanwhile, a buffer layer may be disposed on a surface of the insulating layer 111 and/or the circuit pattern 112. In detail, the buffer layer 200 may be disposed on at least one surface of an upper surface, a lower surface, and side surfaces of the circuit pattern 112 or on a surface of the insulating layer 111 on which the circuit pattern is disposed.

The buffer layer formed on the insulating layer or the circuit pattern will be described in detail below.

At least one via 113 is formed in the insulating layer 111. The via 113 is disposed to be passing through at least one of the plurality of insulating layers 111. The via 113 may pass through only one of the plurality of insulating layers 111, and alternatively, may be formed to commonly pass through at least two insulating layers of the plurality of insulating layers 111. Accordingly, the via 113 electrically connects circuit patterns disposed at surfaces of different insulating layers to each other.

The via 113 may be formed by filling, with a conductive material, a through hole (not shown) passing through at least one of the plurality of insulating layers 111.

The through hole may be formed by any one of mechanical, laser, and chemical processing. When the through hole is formed by mechanical processing, a method such as milling, drilling and routing may be used. When the through hole is formed by laser processing, a method of UV or $CO_2$ laser may be used. And when the through hole is formed by chemical processing, the insulating layer 111 may be opened by using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the via 113 is formed by filling the inside of the through hole with a conductive material. The metal material forming the via 113 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

The first pad 120 is disposed on the insulating layer disposed at the uppermost portion of the plurality of insulating layers 111 and the second pad 140 is disposed under the insulating layer disposed at the lowermost portion of the plurality of insulating layers 111.

In other words, the first pad 120 is disposed on the uppermost insulating layer 111 in which the electronic component 190 is to be formed, among the plurality of insulating layers 111. The first pad 120 may be formed in plural on the uppermost insulating layer. In addition, a part of the first pad 120 may serve as a pattern for signal transmission and the other part thereof may serve as an inner lead electrically connected to the electronic component 190 through the wire and the like. In other words, the first pad 120 may include a wire-bonding pad for wire bonding.

In addition, the second pad 140 is disposed under the lowermost insulating layer to which an external substrate (not shown) is to be attached, among the plurality of insulating layers 111. Like the first pad 120, a part of the second pad 140 also serves as a pattern for signal transmission, and the other part thereof may serve as an outer lead in which the adhesive member 175 is disposed for attachment of the external substrate. In other words, the second pad 140 includes a soldering pad for soldering.

In addition, the first upper metal layer 130 is disposed on the first pad 120 and the second upper metal layer 150 is disposed under the second pad 140. The first upper metal layer 130 and the second upper metal layer 150 are formed of the same material and increase characteristics of the wire bonding or soldering while protecting the first pad 120 and the second pad 140, respectively.

To this end, the first upper metal layer 130 and the second upper metal layer 150 are formed of a metal including gold (Au). Preferably, the first upper metal layer 130 and the second upper metal layer 150 may include pure gold (purity of 99% or more) only, or may be formed of an alloy including gold (Au). When the first upper metal layer 130 and the second upper metal layer 150 are formed of an alloy including gold, the alloy may be formed of a gold alloy including cobalt.

The solder paste 180 is disposed at the uppermost insulating layer among the plurality of insulating layers. The solder paste is an adhesive for fixing the electronic component 190 attached to the insulating substrate 110. Accordingly, the solder paste 180 may be defined to as an adhesive. The adhesive may be a conductive adhesive, or alternatively, the adhesive may be a non-conductive adhesive. That is, the printed circuit board 100 may be a substrate to which the electronic component 190 is attached in a wire-bonding manner, so that a terminal (not shown) of the electronic component 190 may not be disposed on the adhesive. In addition, the adhesive may not be electrically connected to the electronic component 190. Therefore, a non-conductive adhesive may be used as the adhesive, or alternatively, a conductive adhesive may be used as the adhesive.

The conductive adhesive is largely classified into an anisotropic conductive adhesive and an isotropic conductive adhesive, and is basically composed of conductive particles such as Ni, Au/polymer, or Ag, and thermosetting and thermoplastic resins, or a blend type insulation resin mixing characteristics of the two resins.

In addition, the non-conductive adhesive may also be a polymeric adhesive and may preferably be a non-conductive polymer adhesive including a thermosetting resin, a thermoplastic resin, a filler, a curing agent, and a curing accelerator.

Further, the first passivation layer 160, through which at least a part of a surface of the first upper metal layer 130 is exposed, is disposed on the uppermost insulating layer. The first passivation layer 160 is disposed to protect the surface of the uppermost insulating layer, and, for example, may be a solder resist.

In addition, the solder paste 180 is disposed on the first upper metal layer 130 so that the first pad 120 and the electronic component 190 may be electrically connected to each other.

Here, the electronic component 190 may include both a device and a chip. The device may be classified into an active device and a passive device. The active device refers to a device that positively uses non-linear characteristics. The passive device refers to a device that does not use non-linear characteristics even though both linear and non-linear characteristics are present. In addition, the active device may include a transistor, an IC semiconductor chip, and the like and the passive device may include a condenser, a resistor, an inductor, and the like. The passive device is mounted on a substrate together with an ordinary semiconductor package in order to increase a signal processing speed of a semiconductor chip which is an active device, perform a filtering function, or the like.

As a result, the electronic component 190 may include all of a semiconductor chip, a light emitting diode chip, and other driving chips.

In addition, a resin molding part may be formed on the uppermost insulating layer, and accordingly, the electronic component 190 and the first upper metal layer 130 may be protected by the resin molding part.

Meanwhile, the second passivation layer 170 is disposed under the lowermost insulating layer among the plurality of insulating layers. The second passivation layer 170 has an opening exposing a surface of the second upper metal layer 150. The second passivation layer 170 may be formed of a solder resist.

As described earlier, the buffer layer may be disposed on at least one surface of the insulating layer 111 or the circuit pattern 112.

In detail, the buffer layer 200 may be disposed between the insulating layer 111 and the circuit pattern 112 in a region where the insulating layer 111 and the circuit pattern 112 overlap.

The buffer layer 200 may be a surface treatment layer treated on the surface of the insulating layer 111. The buffer layer 200 may be a surface treatment layer to be treated on the surface of the circuit pattern 112.

The buffer layer 200 may be an intermediate layer disposed between the insulating layer and the circuit pattern. The buffer layer 200 may be a coating layer disposed between the insulating layer and the circuit pattern. The buffer layer 200 may be a functional layer that improves adhesion between the insulating layer and the circuit pattern, that is, an adhesion strengthening layer.

FIGS. 2 to 5 are views for describing a position and arrangement relationship of the buffer layer 200.

Referring to FIG. 2, the buffer layer 200 may be disposed on the surface of the circuit pattern. For example, the buffer layer 200 may be disposed on an upper surface and a lower surface of the circuit pattern. That is, the buffer layer 200 may be disposed on a surface that is in contact with or faces the insulating layer 111 among the surfaces of the circuit pattern.

Alternatively, referring to FIG. 3, the buffer layer 200 may be disposed on the surface of the circuit pattern. For example, the buffer layer 200 may be disposed on the upper surface, the lower surface, and both side surfaces of the circuit pattern. That is, the buffer layer 200 may be disposed to surround the entire surface of the circuit pattern.

Alternatively, referring to FIG. 4, the buffer layer 200 may be disposed on the surface of the insulating layer 111. For example, the buffer layer 200 may be disposed on an upper surface and a lower surface of the insulating layer 111. That is, the buffer layer 200 may be disposed on a surface that is in contact with or faces the circuit pattern 112 among surfaces of the insulating layer 111. That is, the buffer layer 200 may be disposed on the entire surface of the insulating layer 111 on which the circuit pattern 112 is disposed.

Alternatively, referring to FIG. 5, the buffer layer 200 may be disposed on the surface of the insulating layer 111. For example, the buffer layer 200 may be disposed on the upper surface and the lower surface of the insulating layer 111. That is, the buffer layer 200 may be disposed on a surface that is in contact with or faces the circuit pattern 112 among the surfaces of the insulating layer 111. That is, the buffer layer 200 may be disposed only in a region where the circuit pattern 112 is disposed on the surface of the insulating layer 111 in which the circuit pattern 112 is disposed.

That is, the buffer layer 200 may be disposed between the insulating layer 111 and the circuit pattern 112. In detail, the buffer layer 200 may be disposed between the insulating layer 111 and the circuit pattern 112, and the buffer layer 200 may be bonded one surface of the insulating layer 111 and one surface of the circuit pattern 112. That is, an end group of the buffer layer, an end group of the insulating layer, an end group of the buffer layer, and an end group of the circuit pattern may be chemically bonded.

The buffer layer 200 may be formed to have a constant thickness. In detail, the buffer layer 200 may be formed as a thin film. In detail, the buffer layer 200 may be formed to have a thickness of 500 nm or less. In more detail, the buffer layer 200 may be formed to have a thickness of 5 nm to 500 nm.

When the thickness of the buffer layer 200 is formed to be 5 nm or less, the thickness of the buffer layer is too thin to sufficiently secure adhesion between the insulating layer and the circuit pattern, and when the thickness of the buffer layer is formed to exceed 500 nm, an effect of improving adhesion according to the thickness is insignificant, the overall thickness of the circuit board may be increased, and a dielectric constant of the insulating layer is increased, so that the transmission loss of the circuit board may be increased in high-frequency applications.

The buffer layer 200 may include a plurality of atoms. The plurality of atoms included in the buffer layer 200 are bonded to each other in the buffer layer to be included in a molecular or ionic form, and the molecules, the molecule, and the ion may be chemically bonded to each other to form a buffer layer.

The buffer layer 200 may include at least one of carbon atoms, nitrogen atoms, oxygen atoms, silicon atoms, sulfur atoms, and metal atoms. In detail, the buffer layer 200 may include all of the carbon atoms, the nitrogen atoms, the oxygen atoms, the silicon atoms, the sulfur atoms, and the metal atoms.

The carbon atoms, the nitrogen atoms, the oxygen atoms, the silicon atoms, the sulfur atoms, and the metal atoms may exist in a molecular form by bonding to each other in the buffer layer, or may exist in an ionic form alone.

The oxygen atoms, the carbon atoms, and the nitrogen atoms among the plurality of atoms may be related to a functional group of the buffer layer bonded to the insulating layer. That is, a functional group formed by molecules including the oxygen atoms, the carbon atoms, the nitrogen atoms, and the like may be chemically bonded to the insulating layer.

In addition, the carbon atoms, the nitrogen atoms, the silicon atoms, and the sulfur atoms among the plurality of atoms may be related to a functional group of the buffer layer bonded to the circuit pattern. That is, the functional group formed by molecules including the carbon atoms, the nitrogen atoms, the silicon atoms, the sulfur atoms, and the like may be chemically bonded to the circuit pattern.

In addition, the metal atoms may bond molecules formed by the carbon atoms, the nitrogen atoms, the oxygen atoms, the silicon atoms, and the sulfur atoms to each other. That is, the molecules formed by the carbon atoms, nitrogen atoms, oxygen atoms, silicon atoms, and sulfur atoms may be chemically bonded through the metal atoms to form a buffer layer. That is, the metal atoms may be disposed between the molecules to serve as a medium for chemically bonding the molecules.

To this end, the carbon atoms, the nitrogen atoms, the oxygen atoms, the silicon atoms, the sulfur atoms, and the metal atoms may be included in a constant mass ratio. In detail, the metal atoms among the plurality of atoms may be included in the largest amount than other atoms, and the carbon atoms, nitrogen atoms, oxygen atoms, silicon atoms, and sulfur atoms may be included in a constant mass ratio based on the metal atoms.

In detail, a mass ratio of the carbon atoms to the metal atoms ((carbon atom/copper atom)*100) may be within a range of 5 to 7.

In addition, a mass ratio ((nitrogen atom/copper atom)*100) of the nitrogen atoms to the metal atoms may be within a range of 1.5 to 7.

In addition, a mass ratio of the oxygen atoms to the metal atoms ((oxygen atom/copper atom)*100) may be within a range of 1.1 to 1.9.

In addition, a mass ratio of the silicon atoms to the metal atoms ((silicon atom/copper atom)*100) may be within a range of 0.5 to 0.9.

In addition, a mass ratio of the atoms sulfur to the metal atoms ((atoms sulfur/atoms copper)*100) may be within a range of 0.5 to 1.5.

The mass ratio of the carbon atoms, the nitrogen atoms, the oxygen atoms, the silicon atoms, and the sulfur atoms to the metal atoms may be related to a bonding force of the insulating layer or the circuit board.

In detail, when the mass ratio of the carbon atoms to the metal atoms ((carbon atom/copper atom)*100) is out of the range of 5 to 7, the bonding force between the buffer layer and the circuit board or the buffer layer and the insulating layer may be weakened.

In addition, when the mass ratio ((nitrogen atom/copper atom)*100) of the nitrogen atoms to the metal atoms is out of the range of 1.5 to 7, the bonding force between the buffer layer and the circuit board or the buffer layer and the insulating layer may be weakened.

In addition, when the mass ratio of the oxygen atoms to the metal atoms ((oxygen atom/copper atom)*100) is out of the range of 1.1 to 1.9, the bonding force between the buffer layer and the insulating layer may be weakened.

In addition, when the mass ratio of the silicon atoms to the metal atoms ((silicon atom/copper atom)*100) is out of the range of 0.5 to 0.9, the bonding force between the buffer layer and the circuit board may be weakened.

In addition, when the mass ratio of the atoms sulfur to the metal atoms ((sulfur atoms/copper atom)*100) is out of the range of 0.5 to 1.5, the bonding force between the buffer layer and the circuit board may be weakened.

Meanwhile, the carbon atoms, the nitrogen atoms, the oxygen atoms, the silicon atoms, the sulfur atoms, and the metal atoms exist in the buffer layer in a form of molecules or ions, and the molecules and the ions may be bonded and connected to each other.

In detail, the buffer layer 200 may include molecules and metal ions formed by the carbon atoms, the nitrogen atoms, the oxygen atoms, the silicon atoms, the sulfur atoms, and the metal atoms. The molecules included in the buffer layer 200 may include at least two types of molecules depending on a size of the molecule or a size of molecular weight. In detail, the molecules may include a macromolecule and a unimolecule.

The macromolecule, the unimolecule, and the metal ion may be bonded in the buffer layer to form a structure that is connected to each other.

In detail, the macromolecule, the unimolecule, and the metal ion may be chemically bonded in the buffer layer by covalent and coordination bonds to form a structure that is connected to each other.

The metal ion may connect the macromolecules, the unimolecules, or the macromolecule and the unimolecule to each other. In detail, the macromolecules, the unimolecules, or the macromolecule and the unimolecule are coordinate-bonded to the metal ion, and accordingly, the macromolecules, the unimolecules, or the macromolecule and the unimolecule may be chemically bounded.

The metal ion may include the same material as the circuit pattern. Alternatively, the metal ion may include a material different from that of the circuit pattern. For example, when the circuit pattern includes copper, the metal ion may include copper or a metal other than copper.

In detail, the metal ion may be formed by the circuit pattern. In detail, the metal ion may be formed by ionizing the circuit pattern including the metal using a separate oxidizing agent. Accordingly, the ionized metal ion may be coordinate-bonded to the macromolecule and the unimolecule in the buffer layer to connect the molecules to each other to form the buffer layer.

Alternatively, a separate metal ion is added at the time of forming the buffer layer, and the metal ion may be coordinate-bonded to the macromolecule and the unimolecule in the buffer layer to connect the molecules to each other to form the buffer layer. At this time, the metal ion added separately may be the same as or different from the metal of the circuit pattern.

The macromolecule and the unimolecule may include at least one of the carbon atoms, the nitrogen atoms, the oxygen atoms, the silicon atoms, and the sulfur atoms.

That is, the macromolecule and the unimolecule may be a molecule including at least one of the carbon atoms, the nitrogen atoms, the oxygen atoms, the silicon atoms, and the sulfur atoms.

In detail, the macromolecule may include a molecule including the carbon atoms and the nitrogen atoms. In detail, the macromolecule may include an azole group including the carbon atoms and the nitrogen atoms.

In addition, the macromolecule may include a molecule including the silicon atoms. In detail, the macromolecule may include a silane group including the silicon atoms.

In addition, the unimolecule may include the carbon atoms, the nitrogen atoms, and the sulfur atoms. That is, the unimolecule may be a molecule including the carbon atoms, the nitrogen atoms, and the sulfur atoms. For example, the unimolecule may include an SCN group to which a thiocyanate group (—SCN) is connected.

Referring to FIG. 6, the buffer layer 200 may include a plurality of functional groups. In detail, the buffer layer 200 may include a first functional group chemically bonded to the insulating layer 111 and a second functional group chemically bonded to the circuit pattern 112.

That is, the macromolecule and the unimolecules may include a plurality of terminal groups, that is, functional groups, chemically bonded to the insulating layer and the circuit pattern. By such functional groups, the insulating layer and the circuit pattern are chemically tightly bonded by the buffer layer, so that the adhesion between the insulating layer and the circuit pattern may be improved.

The first functional group and the second functional group may be defined as terminal groups of the buffer layer connected to one of the macromolecule, the mono atoms, and the metal atoms.

The first functional group may be bonded to the insulating layer 111 by the covalent bond. The first functional group may include functional groups covalent-bonded to the insulating layer 111. In detail, the first functional group may include a hydroxyl group (—OH) and an N group of the azole group.

In addition, the second functional group may be bonded to the circuit pattern 112 by the coordination bond. The second functional group may include functional groups coordinate-bonded to the circuit pattern 112. In detail, the second functional group may include a Si group and the thiocyanate group (—SCN) of the silane group.

The first functional group and the second functional group included in the buffer layer may be chemically bonded to the insulating layer and the circuit pattern, respectively. Accordingly, the adhesion between the insulating layer, which is a dissimilar material, and the circuit pattern may be improved by the buffer layer disposed between the insulating layer and the circuit pattern.

Hereinafter, the present invention will be described in more detail by measuring dielectric constant according to Examples and Comparative Examples. Such Examples are merely presented as examples to describe the present invention in more detail. Therefore, the present invention is not limited to the Examples.

EXAMPLE

A copper layer was formed on an insulating layer containing prepreg (PPG). At this time, a coating layer was coated on a surface in contact with the insulating layer among surfaces of the copper layer, and then the copper layer and the insulating layer were adhered.

Subsequently, a 5 mm*5 mm sample was extracted from the coating layer and any nine points were designated on a surface of the coating layer.

Subsequently, the surface of the coating layer was analyzed using a scanning electron microscope (SEM), and a chemical composition included in the coating layer was analyzed using an energy dispersive X-ray spectroscopy (EDS).

It was analyzed that the coating layer analyzed by the SEM and the EDS includes carbon atoms, nitrogen atoms, oxygen atoms, silicon atoms, sulfur atoms and copper atoms.

Subsequently, the copper layer was patterned to form a circuit pattern, and a circuit board was manufactured.

At this time, the buffer layer included a first functional group including an N group of a hydroxy group (—OH) and an azole group and a second functional group including a Si group of a silane group and a thiocyanate group (—SCN).

Subsequently, evaluation of adhesion and reliability according to a magnitude of roughness of the circuit pattern was performed.

Comparative Example

After forming the circuit pattern in the same manner as in Example except that a copper layer was formed by directly adhering the copper layer on the insulating layer without forming the coating layer on the copper layer and a circuit pattern was formed by patterning the copper layer, evaluation of the adhesion and reliability according to the magnitude of roughness of the circuit pattern was performed.

Adhesion/Reliability Measurement Method

In the evaluation of the adhesion of the circuit patterns according to Example and Comparative Example, a UTM 90° Peel value was measured using UTM equipment.

In addition, reliability evaluation was evaluated by NG when the peel strength (kgf/cm) of the circuit pattern was less than 0.6.

TABLE 1

| Circuit pattern roughness (Ra, mm) | Example (peel strength, kgf/cm) | Comparative Example (peel strength, kgf/cm) |
| --- | --- | --- |
| 0.1 | 0.65 | 0.37 |
| 0.2 | 0.72 | 0.41 |
| 0.3 | 0.73 | 0.45 |
| 0.4 | 0.74 | 0.52 |
| 0.5 | 0.78 | 0.60 |
| 0.6 | 0.81 | 0.67 |

TABLE 2

| Circuit pattern roughness (Ra, mm) | Example (reliability, whether or not peeling) | Comparative Example (reliability, whether or not peeling) |
| --- | --- | --- |
| 0.1 | OK | NG |
| 0.2 | OK | NG |
| 0.3 | OK | NG |
| 0.4 | OK | NG |
| 0.5 | OK | NG |
| 0.6 | OK | NG |

Referring to Table 1 and Table 2, it can be seen that the circuit board according to Example has improved reliability compared to the circuit board according to Comparative Example. In detail, the circuit board according to Example forms the circuit pattern on the coating layer formed on the insulating layer. Accordingly, it can be seen that as the coating layer tightly chemically bonds to the insulating layer and the circuit pattern, a peel strength of the circuit pattern is increased, thereby improving the adhesion of the circuit pattern and the reliability of the circuit board.

That is, it can be seen that the circuit board according to Example may have adhesion capable of securing the reliability of the circuit board even when the roughness of the circuit pattern is reduced. In detail, it can be seen that the circuit board according to Example may have the adhesion capable of securing the reliability of the circuit board even when the surface roughness of the circuit pattern is 0.5 or less or in a range of 0.1 to 0.5.

That is, when the circuit board according to Example is applied to high-frequency applications, it is possible to reduce the transmission loss due to a skin effect by reducing the roughness of the circuit pattern, and even when the surface roughness is low, it is possible to secure the reliability of the circuit pattern by improving the adhesion of the circuit pattern by the coating layer.

On the other hand, in the case of the circuit board according to Comparative Example, the circuit pattern is directly formed on the insulating layer. Therefore, it can be seen that as the insulating layer and the circuit pattern are formed of different materials, the adhesion of the circuit pattern, that is, the peel strength, is very low.

That is, it can be seen that the reliability of the circuit board according to Comparative Example may not be secured unless the surface roughness of the circuit pattern is increased, and when the surface roughness of the circuit pattern is low, the reliability of the circuit board is deteriorated.

Therefore, when the circuit board according to Comparative Example is applied to high-frequency applications, it can be seen that the transmission loss due to the skin effect is increased by the surface roughness of the circuit pattern.

The circuit board according to the embodiment may include the buffer layer disposed between the insulating layer and the circuit pattern.

That is, in the circuit board according to Example, the buffer layer may be formed on the surface of the circuit pattern or the buffer layer may be formed on the insulating layer.

The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that the adhesion is reduced.

Therefore, by disposing the buffer layer chemically bonded to the insulating layer and the circuit pattern respectively between the insulating layer and the circuit pattern, the adhesion between the insulating layer and the circuit pattern may be improved.

That is, the buffer layer includes the plurality of functional groups bonded to the insulating layer and the circuit pattern, and the functional groups are chemically bonded to the insulating layer and the circuit pattern by the covalent bond or the coordination bond, thereby forming improving the adhesion between the insulating layer and the circuit pattern.

Accordingly, even when the surface roughness of the insulating layer is reduced, it is possible to secure adhesion reliability between the insulating layer and the circuit pattern.

Therefore, even when the circuit board according to the embodiment is used for high-frequency applications, it is possible to reduce the transmission loss of high-frequency signals by keeping the surface roughness of the circuit pattern low, and even when the surface roughness of the circuit pattern is kept low, since the adhesion between the insulating layer and the circuit pattern may be secured by the buffer layer, the overall reliability of the circuit pattern may be secured.

The characteristics, structures and effects described in the embodiments above are included in at least one embodiment but are not limited to one embodiment. Furthermore, the characteristics, structures, effects, and the like illustrated in each of the embodiments may be bonded or modified even with respect to other embodiments by those of ordinary skill in the art to which the embodiments pertain. Thus, it would be construed that the contents related to such a combination and such a modification are included in the scope of the embodiments.

In addition, the above description has been focused on the embodiments, but it is merely illustrative and does not limit the present invention. Those skilled in the art to which the embodiments pertain may appreciate that various modifications and applications not illustrated above are possible without departing from the essential features of the embodiment. For example, each component particularly represented in the embodiments may be modified and realized. In addition, it should be construed that differences related to such a modification and an application are included in the scope of the present invention defined in the appended claims.

The invention claimed is:

1. A circuit board comprising:
an insulating layer;
a circuit pattern disposed on the insulating layer; and
a buffer layer disposed between the insulating layer and the circuit pattern,
wherein the buffer layer includes carbon atoms, nitrogen atoms, oxygen atoms, silicon atoms, sulfur atoms, and copper atoms,
a mass ratio of the carbon atoms to the copper atoms ((carbon atom/copper atom)*100) is within a range of 5 to 7,
a mass ratio of the nitrogen atoms to the copper atoms ((nitrogen atom/copper atom)*100) is within a range of 1.5 to 7,
a mass ratio of the oxygen atoms to the copper atoms ((oxygen atom/copper atom)*100) is within a range of 1.1 to 1.9,
a mass ratio of the silicon atoms to the copper atoms ((silicon atom/copper atom)*100) is within a range of 0.5 to 0.9, and
a mass ratio of the sulfur atoms to the copper atoms ((sulfur atom/copper atom)*100) is within a range of 0.5 to 1.5.

2. The circuit board of claim 1, wherein the buffer layer is disposed between a surface of the insulating layer and the circuit pattern.

3. The circuit board of claim 1, wherein the buffer layer is disposed on an upper surface, a lower surface, and side surfaces of the circuit pattern.

4. The circuit board of claim 1, wherein the buffer layer is disposed on an upper surface and a lower surface of the circuit pattern.

5. The circuit board of claim 1, wherein a thickness of the buffer layer is 5 nm to 500 nm.

6. The circuit board of claim 1, wherein the carbon atoms, the nitrogen atoms, the oxygen atoms, the silicon atoms, the sulfur atoms, and the copper atoms are provided in the buffer layer in molecular or ionic form.

7. The circuit board of claim 1, wherein the carbon atoms, the nitrogen atoms, the oxygen atoms, the silicon atoms, and the sulfur atoms are bonded to each other and are provided in a plurality of molecules of the buffer layer,
the copper atoms are provided as a copper ion, and
the molecules are chemically bonded to the copper ion.

8. The circuit board of claim 1, wherein the buffer layer includes a plurality of terminal groups connected to the insulating layer and the circuit pattern, and
the terminal groups are covalent-bonded or coordinate-bonded to the insulating layer and the circuit pattern.

9. The circuit board of claim 1,
wherein the buffer layer includes a first functional group bonded to the insulating layer and a second functional group bonded to the circuit pattern.

10. The circuit board of claim 9, wherein the first functional group includes a hydroxyl group (—OH) and an N group of an azole group, and
the second functional group includes a Si group and a thiocyanate group (—SCN) of a silane group.

11. The circuit board of claim 10, wherein the first functional group is covalent-bonded to the insulating layer,
the second functional group is coordinate-bonded to the circuit pattern.

12. The circuit board of claim 1, wherein the circuit pattern includes at least one metal material selected from gold (Au), silver (Ag), platinum (Pt), titanium (Ti), tin (Sn), copper (Cu), and zinc (Zn).

13. The circuit board of claim 1, wherein the insulating layer includes a plurality of insulating layers,
the circuit pattern is disposed on each of the insulating layers, and
the buffer layer is disposed between at least one insulating layer of the plurality of insulating layers and the circuit pattern.

14. The circuit board of claim 1, wherein the buffer layer is disposed to surround the circuit pattern.

15. The circuit board of claim 1, wherein the buffer layer is disposed only where the circuit pattern and the insulating layer overlap.

16. A circuit board comprising:
an insulating layer;
a circuit pattern disposed on the insulating layer; and
a buffer layer disposed between the insulating layer and the circuit pattern,
wherein the buffer layer includes a first functional group that is chemically bonded to the insulating layer, and a second functional group that is bonded to the circuit pattern, the first functional group including oxygen atoms, carbon atoms and nitrogen atoms, and the second functional group including carbon atoms, nitrogen atoms, silicon atoms and sulfur atoms
wherein the buffer layer further includes metal atoms to bond with the oxygen atoms, the carbon atoms, the nitrogen atoms, the silicon atoms and the sulfur atoms,
wherein the metal atoms are copper atoms,
a mass ratio of the carbon atoms to the copper atoms ((carbon atom/copper atom)*100) is within a range of 5 to 7,
a mass ratio of the nitrogen atoms to the copper atoms ((nitrogen atom/copper atom)*100) is within a range of 1.5 to 7,
a mass ratio of the oxygen atoms to the copper atoms ((oxygen atom/copper atom)*100) is within a range of 1.1 to 1.9,
a mass ratio of the silicon atoms to the copper atoms ((silicon atom/copper atom)*100) is within a range of 0.5 to 0.9, and
a mass ratio of the sulfur atoms to the copper atoms ((sulfur atom/copper atom)*100) is within a range of 0.5 to 1.5.

\* \* \* \* \*